US009343603B2

(12) United States Patent
Inoue et al.

(10) Patent No.: US 9,343,603 B2
(45) Date of Patent: May 17, 2016

(54) METHOD FOR MANUFACTURING SOLAR CELL MODULE AND LAMINATOR

(71) Applicant: SHARP KABUSHIKI KAISHA, Osaka-shi, Osaka (JP)

(72) Inventors: Tetsuyoshi Inoue, Osaka (JP); Hiromasa Tanamura, Osaka (JP); Kiyotaka Sakurai, Osaka (JP); Mitsuji Gotoh, Osaka (JP); Yuhsuke Fukuoka, Osaka (JP); Shohichi Ohyama, Osaka (JP)

(73) Assignee: SHARP KABUSHIKI KAISHA, Osaka-shi, Osaka (JP)

(*) Notice: Subject to any disclaimer, the term of this patent is extended or adjusted under 35 U.S.C. 154(b) by 0 days.

(21) Appl. No.: 14/376,996

(22) PCT Filed: Nov. 12, 2012

(86) PCT No.: PCT/JP2012/079217
§ 371 (c)(1),
(2) Date: Aug. 6, 2014

(87) PCT Pub. No.: WO2013/118361
PCT Pub. Date: Aug. 15, 2013

(65) Prior Publication Data
US 2015/0013876 A1 Jan. 15, 2015

(30) Foreign Application Priority Data
Feb. 7, 2012 (JP) ................................. 2012-024344

(51) Int. Cl.
*H01L 31/048* (2014.01)
*B32B 37/10* (2006.01)
*B32B 37/06* (2006.01)
*H01L 31/18* (2006.01)
*B32B 41/00* (2006.01)

(52) U.S. Cl.
CPC .............. *H01L 31/048* (2013.01); *B32B 37/06* (2013.01); *B32B 37/10* (2013.01);
(Continued)

(58) Field of Classification Search
CPC .............. H01L 31/048; H01L 31/0488; B32B 2457/12; B32B 37/1009; B32B 2309/12; Y10T 156/10; Y10T 156/17
See application file for complete search history.

(56) References Cited

U.S. PATENT DOCUMENTS

| 2008/0230164 A1 | 9/2008 | Nishitani | |
| 2011/0005066 A1* | 1/2011 | Crofoot et al. | 29/623.5 |
| 2012/0171801 A1* | 7/2012 | Jette | B32B 37/1018 438/64 |

FOREIGN PATENT DOCUMENTS

| JP | 2000-347918 | 12/2000 |
| JP | 4023961 | 10/2007 |

(Continued)

OTHER PUBLICATIONS

International Search Report for PCT/JP2012/079217, mailed Dec. 11, 2012.

*Primary Examiner* — Carson Gross
(74) *Attorney, Agent, or Firm* — Nixon & Vanderhye, P.C.

(57) ABSTRACT

By increasing a pressure in a chamber flange (10) at a predetermined rate, the number of gas molecules that carry inner thermal energy is increased, which results in a uniform temperature distribution. Thus, non-melting residues of, air bubbles in, and insufficient expansion of the sealing resin (43) are reduced. After removal of the air bubbles (45), a pressure is applied between a substrate (41) and a sealing substrate (44), thereby the substrate (41), a solar cell (42), the sealing resin (43) and the sealing substrate (44) are adhered to each other.

2 Claims, 4 Drawing Sheets

(52) U.S. Cl.
CPC ....... *B32B 37/1009* (2013.01); *H01L 31/0488* (2013.01); *H01L 31/18* (2013.01); *B32B 41/00* (2013.01); *B32B 2309/04* (2013.01); *B32B 2309/12* (2013.01); *B32B 2309/66* (2013.01); *B32B 2309/68* (2013.01); *B32B 2457/12* (2013.01); *Y02E 10/50* (2013.01); *Y10T 156/10* (2015.01)

(56) References Cited

FOREIGN PATENT DOCUMENTS

| | | |
|---|---|---|
| JP | 2008-230357 | 10/2008 |
| JP | 2011-135068 | 7/2011 |
| JP | 2011135068 A * | 7/2011 |

* cited by examiner

METHOD FOR MANUFACTURING SOLAR CELL MODULE AND LAMINATOR

This application is the U.S. national phase of International Application No. PCT/JP2012/079217 filed 12 Nov. 2012 which designated the U.S. and claims priority to JP Patent Application No. 2012-024344 filed 7 Feb. 2012, the entire contents of each of which are hereby incorporated by reference.

TECHNICAL FIELD

The present invention relates to a method for manufacturing a solar cell module of laminated glass structure, and a laminator used for manufacturing.

BACKGROUND ART

In a solar cell module, solar cells are sealed on a glass substrate by a sealing resin. On the solar cells, a sealing glass substrate is laminated. Such a solar cell module is manufactured using a laminator.

The laminator is made up of an upper and a lower chambers, in which a rubber diaphragm sheet is provided. Such a configuration is widely adapted to common solar cell modules. That is, the solar sell module is placed on a strong metallic lower hot plate included in the laminator and pressed from above the solar sell module via the flexible diaphragm sheet. Thus, a good processing state can be obtained while a mechanical stress to the solar cell having a low strength is suppressed. One example of such a laminator is described in Patent Document 1.

PRIOR ART REFERENCE

Patent Document

[Patent Document 1] JP 4023961

SUMMARY OF INVENTION

Problems to be Solved by Invention

When a solar cell module of laminated glass structure is under processing using a laminator to which the above configuration is adopted, if the time period for processing is less than or equal to about ten minutes, the following cases may remarkably appear: non-melting residues of the sealing resin in the solar cell module; remaining air bubbles in the solar cell module; and thinness of the sealing resin (hereinafter referred to as a "shrinkage cavity") around the solar cell module. Also, when the solar cell module of laminated glass structure is under processing using the above laminator, directly after the start of the processing, circumference portions of the solar cell substrate on the lower hot plate and of the sealing glass substrate on the side of the diaphragm sheet may be bent upward. For this reason, it takes time to reduce the bent of each glass substrate, which results in a prolonged processing time.

Thus, it is necessary to reduce the non-melting residues of the sealing resin and the remaining air bubbles in the solar cell module, the shrinkage cavity around the module, and the bent of each glass substrate. It is possible to obtain a good processing state by purging air in the chamber for about three minutes, and after that, by applying a pressure of several dozen kPa on the solar cell module for about 10-20 minutes. In this case however, it is difficult to obtain mass productivity because of a prolonged processing time. In some cases, the prolonged processing time causes a remarkable protrusion of the sealing resin around the solar cell module and a shrinkage cavity. For this reason, the sealing quality around the module degrades, and furthermore the sealing resin is adhered to the inside of the chamber of the laminator. Thus, the inside should be frequently cleaned, which is not suitable for the mass productivity.

The present invention was made in consideration of such circumstances. An object of the present invention is to provide a method for manufacturing a solar cell module to prevent: degradation of yield due to the non-melting residues of the sealing resin, the inner air bubbles and the shrinkage cavity; and the prolonged processing time due to maintaining a vacuum state for a long time.

Means for Solving Problems

A method for manufacturing a solar cell module according to the present invention, in which a bonding material is laminated on a semiconductor layer on a substrate and a sealing glass substrate is bonded, includes the steps of: heating the bonding material in a chamber; depressurizing an inside of the chamber; and increasing a pressure in the chamber at a predetermined rate.

In the method for manufacturing the solar cell module according to the present invention, the pressure in the chamber is increased at the predetermined rate. Thus, it is possible to prevent degradation of yield due to the non-melting residues of the sealing resin, the inner air bubbles and the shrinkage cavity. Also, it is possible to prevent a prolonged processing time due to maintaining a vacuum state for a long time.

Also, in the method for manufacturing the solar cell module according to the present invention, the bonding material may be heated while the pressure in the chamber is increased at the rate in the step of increasing the pressure in the chamber.

In this way, in the method for manufacturing the solar cell module according to the present invention, by heating the bonding material, it is possible to adhere the substrate, the semiconductor layer, the bonding material and the glass substrate to each other.

In the method for manufacturing the solar cell module according to the present invention, after the step of depressurizing the inside of the chamber, a pressure may be applied between the substrate and the glass substrate.

In this way, in the method for manufacturing the solar cell module according to the present invention, it is possible to adhere the substrate, the semiconductor layer, the bonding material and the glass substrate to each other.

Also, in the method for manufacturing the solar cell module according to the present invention, after increasing the pressure in the chamber, the pressure in the chamber may be maintained so as to fall within a predetermined range. In such a case, the pressure in the chamber may be controlled so as to increase or decrease within the predetermined range.

In this way, in the method for manufacturing the solar cell module according to the present invention, it is possible to prevent the non-melting residues of the sealing resin, the inner air bubbles and the shrinkage cavity generated due to the pressing force that is decreased too much.

A laminator of the present invention is used for manufacturing the solar cell module in which the bonding material is laminated on the semiconductor layer on the substrate and the sealing glass substrate is bonded. The laminator includes an upper member forming an upper chamber and a lower member forming a lower chamber. The upper member is connected to an air purge valve and an atmospheric pressure valve via gas pipe connections. The lower member is connected to an air purge valve, an atmospheric pressure valve and a leak valve via gas pipe connections. On the upper member, a diaphragm is provided. The diaphragm is made of an elastic member to cover an opening. In the lower member, a lower hot plate is provided. The lower hot plate heats the solar cell module placed thereon.

EFFECTS OF INVENTION

In the method for manufacturing the solar cell module according to the present invention, it is possible to obtain an effect, by increasing the pressure in the chamber at the predetermined rate, to prevent: degradation of yield due to the non-melting residues of the sealing resin, the inner air bubbles and the shrinkage cavity; the prolonged processing time due to maintaining the vacuum state for a long time; and dirt by the bonding material in the laminator.

MODES FOR CARRYING OUT INVENTION

Figure 1:
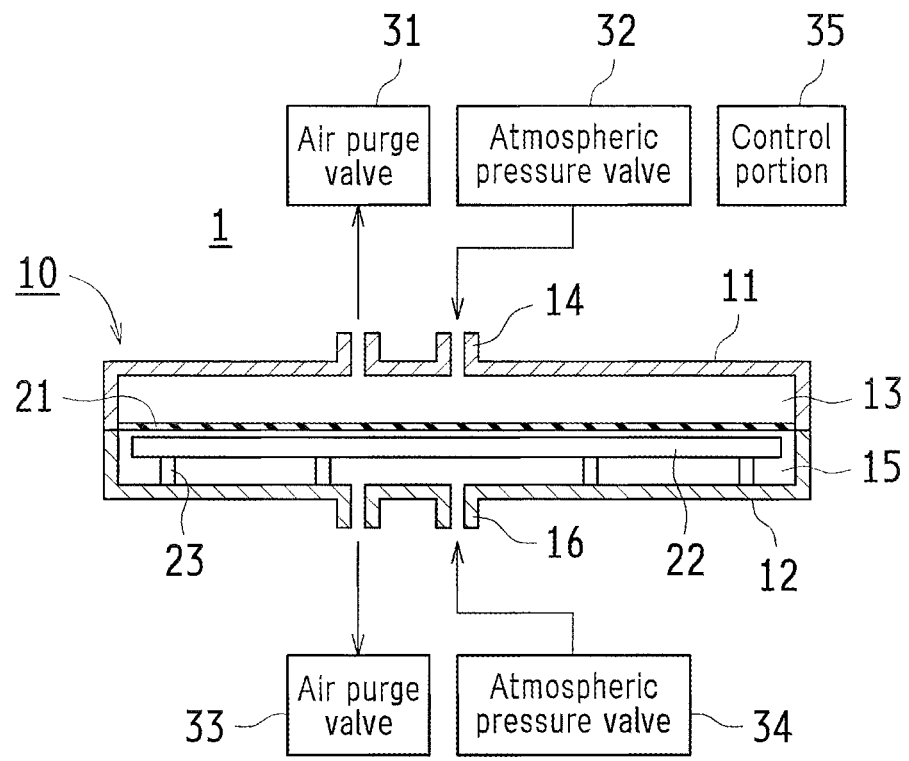
FIG. 1 is a cross-sectional view of a laminator used for a method for manufacturing a solar cell module of the present invention.

Hereinafter, description will be given on an embodiment of the present invention with reference to drawings.
FIG. 1 is a cross-sectional view of a laminator 1 that is adopted to perform a method for manufacturing a solar cell module of the present invention. Description will be given on the laminator 1 with reference to FIG. 1. The laminator 1 includes a chamber flange 10 constituted by an upper member 11 and a lower member 12. The upper member 11 is to form an upper chamber 13 in the inside. In a center portion of the upper member 11, gas pipe connections 14 are provided. The lower member 12 is to form a lower chamber 15 in the inside. In a center portion of the lower member 12, gas pipe connections 16 are provided. The upper chamber 13 and the lower chamber 15 are sealed by seal members (not shown) provided at respective facing side edges where the upper chamber 13 and the lower chamber 15 make contact with each other.
The gas pipe connections 14, 16 are provided to purge air from/introduce air into the respective upper chamber 13 and the lower chamber 15. The respective gas pipe connections 14 are connected to an air purge valve 31 and an atmospheric pressure valve 32. The respective gas pipe connections 16 are connected to an air purge valve 33 and an atmospheric pressure valve 34. The air purge valves 31, 33 and the atmospheric pressure valves 32, 34 are controlled by a control portion 35. When the air purge valves 31, 33 are opened, the respective insides of the upper chamber 13 and the lower chamber 15 are vacuumized. When the atmospheric pressure valves 32, 34 are opened, the respective insides of the upper chamber 13 and the lower chamber 15 are turned to atmospheric pressure.

The upper member 11 includes a diaphragm 21 that seals an opening portion. The diaphragm 21 is made, for example, of an elastic member such as a rubber. The upper chamber 13 and the lower chamber 15 are separated from each other by the diaphragm 21. The lower member 12 includes a lower hot plate 22. The lower hot plate 22 is fixed to the lower member 12 by support members 23. The lower hot plate 22 heats up a solar cell module (not shown) placed thereon. A temperature of the lower hot plate 22 is also controlled by the control portion 35.

Figure 7:
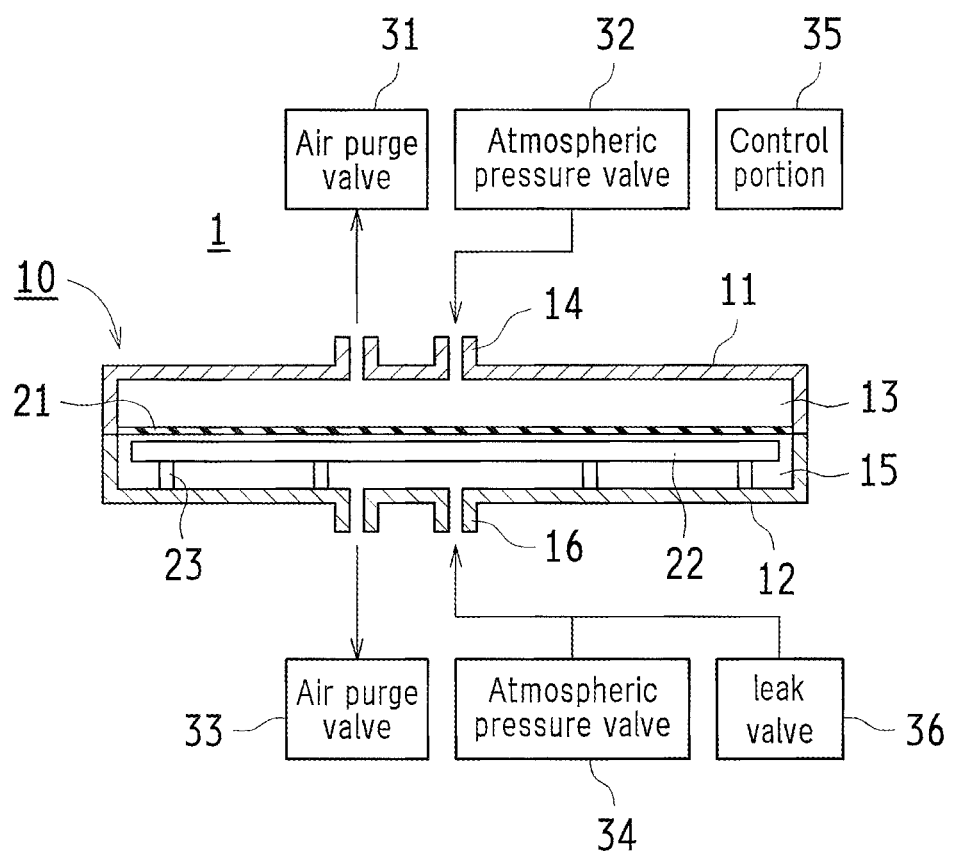
FIG. 7 is a cross-sectional view of the laminator used for the method for manufacturing the solar cell module of the present invention, in which a lower chamber includes a leak valve.

Note that in FIG. 1, the configuration with the air purge valve 31, the atmospheric pressure valve 32, the air purge valve 33 and the atmospheric pressure valve 34 is shown as the most simplified configuration of the laminator. Thus, in some cases, a leak valve 36 is also provided apart from the above valves 31-34 (see FIG. 7). The leak valve 36 is connected to the gas pipe connection 16 on the side of the lower chamber 15, and is controlled by the control portion 35. The leak valve 36 has a function to approximate the pressure in the lower chamber 15 to the atmospheric pressure at a variation rate smaller than that of the atmospheric pressure valve 34.

Figure 2:
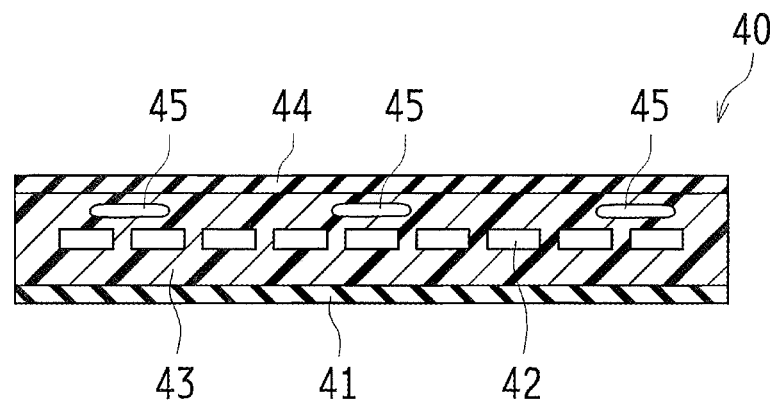
FIG. 2 is a cross-sectional view of the solar cell module.

FIG. 2 is a cross-sectional view of a solar cell module 40.
In FIG. 2, the solar cell module 40 is made by a plurality of solar cells 42, each of which is a semiconductor layer, the plurality of solar cells 42 being sealed on a substrate 41 by a sealing resin 43 as a bonding material. An EVA resin or an ionomer resin can be used as the sealing resin 43. A sealing substrate 44 is laminated on the sealing resin 43. The sealing resin 43 has approximately the same external dimension as the substrate 41 and the sealing substrate 44. The sealing resin 43 includes an air bubble 45. The air bubble 45 exists because air is incorporated when the sealing resin 43 is interposed between the substrate and the sealing substrate 44.

Figure 3:
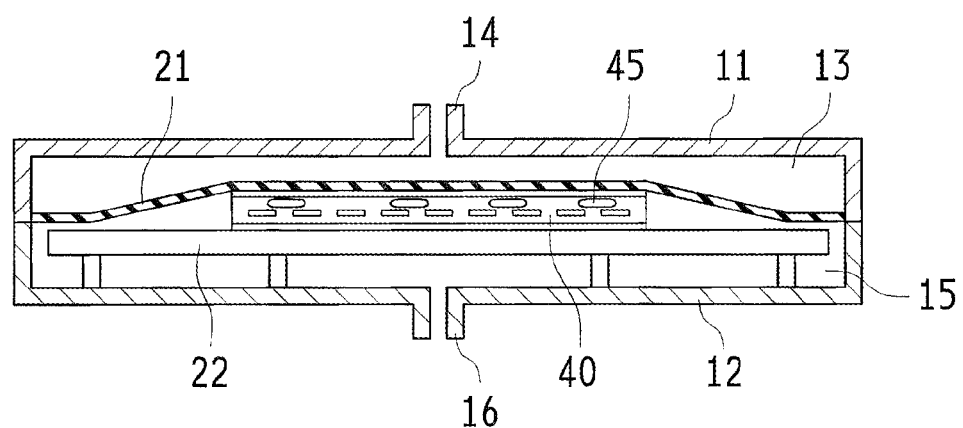
FIG. 3 is a diagram showing a state in which the solar cell module is set in the laminator.
Figure 4:
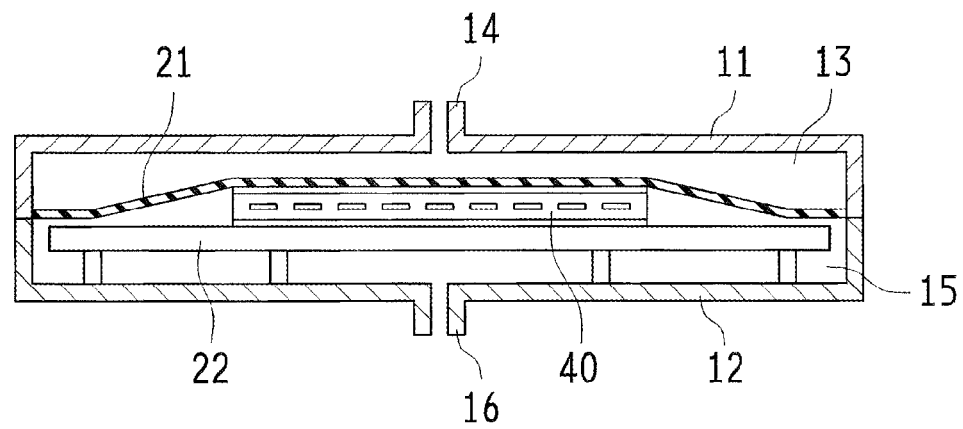
FIG. 4 is a diagram showing a state in which air is purged after setting the solar cell module in the laminator.
Figure 5:
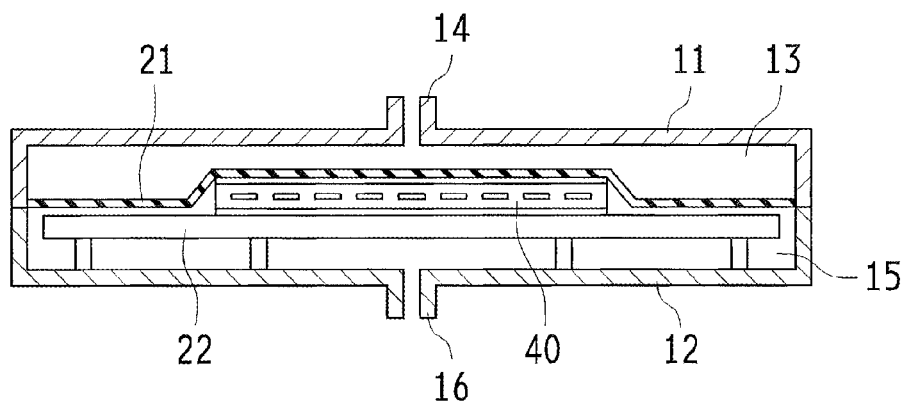
FIG. 5 is a diagram showing a state in which an upper portion of a diaphragm is turned to atmospheric pressure after setting the solar cell module in the laminator.
Figure 6:
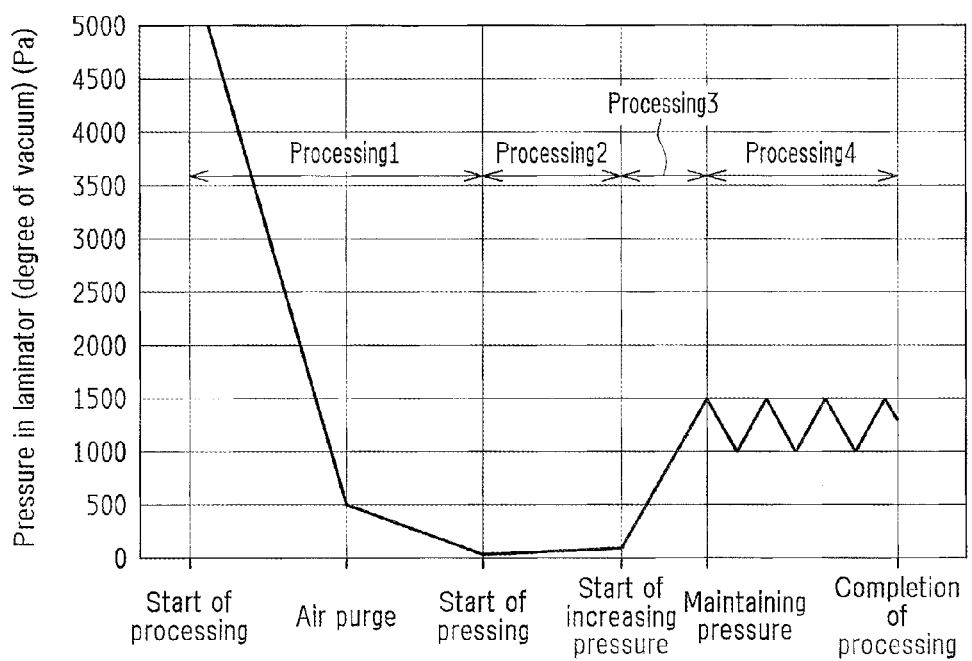
FIG. 6 is a graph showing a pressure transition during processing of the solar cell module in the laminator.

FIGS. 3, 4 and 5 are diagrams for describing the method for manufacturing the solar cell module 40 shown in FIG. 2. Specifically, FIG. 3 shows a state in which the solar cell module 40 is set in the laminator 1, FIG. 4 shows a state in which air is purged after setting the solar cell module 40 in the laminator 1, and FIG. 5 shows a state in which an upper portion of the diaphragm is turned to the atmospheric pressure after setting the solar cell module 40 in the laminator 1. FIG. 6 shows a pressure transition during processing of the solar cell module 40 in the laminator. Its vertical axis indicates a degree of vacuum from 0 to 5000 Pa in the laminator and its horizontal axis indicates a pressure control process consisting of steps 1-4.

Next, description will be given on the method for manufacturing the solar cell module according to the embodiment of the present invention with reference to FIGS. 1-6.
(Step 1)
Before the start of Step 1, the upper chamber 13 shown in FIG. 1 is opened from the lower chamber 15 so that the solar cell module 40 shown in FIG. 2 is disposed on the lower hot plate 22, and then, the upper chamber 13 is closed. In such a state, the diaphragm 21 covers the solar cell module 40.
When Step 1 shown in FIG. 6 is started, the upper chamber 13 and the lower chamber 15 are separated from each other by the diaphragm 21 as shown in FIG. 3. The atmospheric pressure valves 32, 34 are opened so that the respective insides of the upper chamber 13 and the lower chamber 15 are turned to the atmospheric pressure. The lower hot plate 22 is controlled by the control portion 35 so as to have a high temperature compared to a melting point of the sealing resin 43 of the solar cell module 40.

Then, the air purge valves 31, 33 are opened so that the air is purged via the gas pipe connections 14, 16, thus the respective insides of the upper chamber 13 and the lower chamber 15 are depressurized.

In this way, by depressurizing the respective insides of the upper chamber 13 and the lower chamber 15 to maintain the pressure less than or equal to 50 Pa, the vacuum state is established. Thus, from the start of the processing, the air bubbles 45 of the sealing resin 43 of the solar cell module 40 can be deaerated by purging the air. Then the processing advances to Step 2.

(Step 2)

Steps 1-2 take approximately several minutes. In Step 2, as shown in FIG. 6, pressing is started. That is, the air is purged in the lower chamber 15 of the laminator 1, and the air is introduced into the upper chamber 13 above the diaphragm 21. Thereby, as shown in FIG. 4, all of the substrate 41, the solar cell 42, the sealing resin 43 and the sealing substrate 44 are pressurized by the diaphragm 21 and adhered to each other.

Since the lower hot plate 22 is heated to have a high temperature compared to the melting point of the sealing resin 43, the sealing resin 43 is melted to seal the solar cell module 40. However, in this state, the inside of the lower chamber 15 under the diaphragm 21 is in a vacuum state. Thus, thermal conductivity is not good and a temperature distribution on the module face is generated, which easily results in generation of non-melting residues of the sealing resin 43. In the vacuum state, the thermal conductivity becomes small because the number of gas molecules that carry thermal energy is very small. Consequently, it is difficult to uniformly heat the entire solar cell module 40.

(Step 3)

In Step 3, the pressure in the lower chamber 15 is increased at a predetermined rate. At this time, by leaking the lower chamber 15, the number of gas molecules that carry thermal energy in the lower chamber 15 is increased, which results in a uniform temperature distribution.

Specifically, in Step 3, the air or $N_2$ is introduced into the lower chamber 15 under the diaphragm 21 so that the pressure is increased up to 1000-1500 Pa. At this time, the pressure in the lower chamber 15 is increased so that a leak rate is turned to 40±5.0 Pa per second. When the pressure is increased, the number of gas molecules that carry thermal energy is increased, accordingly, the mean free path is changed. As a result, the solar cell module 40 can be uniformly heated by increasing the pressure up to a region where an amount of heat transfer by gas is independent of the pressure. Thus, the bonding processing can be performed without non-melting residues of the sealing resin 43 and air bubbles 45.

However, if the pressure is increased too rapidly, delamination of the substrate 41 and the sealing substrate 44 occurs, which may result in generation of the air bubbles in and a shrinkage cavity of the sealing resin 43 around the solar cell module 40. Also, if the pressure is increased too slowly, the effect to uniformly heat the solar cell module 40 is insufficient, which may result in insufficient prevention of the non-melting residues of the sealing resin 43. In order to prevent the above, an increase rate of the pressure is controlled. The leak rate is set to 40±5.0 Pa per second because at this rate, it is possible to prevent the non-melting residues of the sealing resin 43 and to obtain uniform bonding. However, the pressure and the leak rate may be changed depending on a kind of a sealing agent.

(Step 4)

After increasing the pressure in the lower chamber 15, the pressure in the lower chamber 15 is maintained to fall within a predetermined range. When the pressure in the lower chamber 15 is increased, a pressing force of the diaphragm 21 is decreased. Thus, by maintaining the pressure in the lower chamber 15 within the predetermined range, the pressing force of the diaphragm 21 can be maintained.

When the pressing force of the diaphragm 21 is decreased too much, the air bubbles 45 and the shrinkage cavity by the non-melting residues of the sealing resin 43 are generated around the solar cell module 40 because of the difference between a coefficient of expansion of the substrate 41 and that of the sealing substrate 44. Accordingly, the sealing resin 43 may protrude from the circumference of the solar cell module 40 in the laminator 1 to adhere to the inside of the laminator 1. In order to prevent the above, pressure control is performed using, for example, an APC (Automatic Pressure Control) system. At this time, a maintained pressure is controlled to increase or decrease to fall within the range of 1000-1500 Pa, or controlled to be a constant value. The processing time period from the start of increasing the pressure (start of Step 3) to completion of maintaining the pressure is, for example, two to six minutes. After completion of maintaining the pressure, the inside of the lower chamber 15 is again turned to the atmospheric pressure, and the upper chamber 13 and the lower chamber 15 are opened to take out the solar cell module 40 from the inside of the laminator 1.

If the laminator 1 does not include the leak valve 36, it is possible to increase the pressure of the lower chamber 15 in Step 3 and maintain the pressure of the lower chamber 15 in Step 4 using the atmospheric pressure valve 34. However, in this case, it is not possible to use a valve having a large variation rate of the pressure as the atmospheric pressure valve 34. Thus, it takes longer time to turn the inside of the lower chamber 15 to the atmospheric pressure in Step 4, which results in a prolonged processing time.

In contrast, when the laminator 1 includes the leak valve 36, increasing the pressure of the lower chamber 15 in Step 3 and maintaining the pressure of the lower chamber 15 in Step 4 are performed using the leak valve 36. The leak valve 36 can approximate the pressure in the lower chamber 15 to the atmospheric pressure at the variation rate smaller than that of the atmospheric pressure valve 34. In this case therefore, the above pressure control can be accurately performed using the leak valve 36 having the small variation rate of the pressure, and furthermore, in Step 4, when the inside of the lower chamber 15 is again turned to the atmospheric pressure, it is possible to turn rapidly the inside of the lower chamber 15 to the atmospheric pressure using the atmospheric pressure valve 34 having the large variation rate of the pressure.

The solar cell module 40 in FIG. 2 is exemplarily shown as a crystal type solar cell module. However, the type of the solar cell module is not limited to the above embodiment provided that it is of laminated glass structure. As the solar cell module 40, it is possible to exemplarily provide a thin-film solar cell module having a configuration in which a transparent electrode layer, a semiconductor layer and a back reflective electrode layer are laminated on a glass substrate, and a solar cell module having a configuration in which a plurality of solar cells using semiconductor wafers are disposed and connected to each other on a glass substrate. A crystal silicon solar cell and a compound solar cell such as GaAs type may be used as the solar cell using the semiconductor wafer.

The present invention can be embodied and practiced in other different forms without departing from the spirit and essential characteristics thereof. Therefore, the above-described embodiment is considered in all respects as illustrative and not restrictive. The scope of the present invention is indicated by the appended claims rather than by the foregoing description. All variations and modifications falling within the equivalency range of the appended claims are intended to be embraced therein.

DESCRIPTION OF REFERENCE NUMERALS

1 Laminator
10 Chamber flange
11 Upper member
12 Lower member
13 Upper chamber
14, 16 Gas pipe connections
15 Lower chamber
21 Diaphragm
22 Lower hot plate
23 Support member
31, 33 Air purge valves
32, 34 Atmospheric pressure valves
35 Control portion
40 Solar cell module
41 Substrate
42 Solar cell
43 Sealing resin
44 Sealing substrate
45 Air bubble

The invention claimed is:
1. A method for manufacturing a solar cell module in which a bonding material is laminated on a semiconductor layer on a substrate and a sealing glass substrate is bonded, the method comprising the steps of:
a first step of disposing a solar cell module on a lower chamber of a laminator, the laminator including an upper chamber, the lower chamber and a diaphragm separating the upper chamber from the lower chamber, and starting to heat the bonding material while depressurizing the upper chamber and the lower chamber;
a second step of increasing a pressure in the upper chamber to press the solar cell module via the diaphragm;
a third step of increasing a pressure in the lower chamber at a predetermined rate by leaking the lower chamber; and
after the third step, a fourth step of maintaining the pressure in the lower chamber within a predetermined range;
wherein the pressure in the lower chamber in the fourth step is controlled so as to increase or decrease within the predetermined range.
2. The method for manufacturing the solar cell module according to claim 1, wherein, in the third step, the bonding material is heated while the pressure in the lower chamber is increased at the rate.

* * * * *